United States Patent [19]

Jayaraman et al.

[11] Patent Number: 4,609,929
[45] Date of Patent: Sep. 2, 1986

[54] CONDUCTIVITY-ENHANCED COMBINED LATERAL MOS/BIPOLAR TRANSISTOR

[75] Inventors: Raj Jayaraman, Brookline, Mass.; Barry M. Singer, New York, N.Y.

[73] Assignee: North American Philips Corporation, New York, N.Y.

[21] Appl. No.: 684,442

[22] Filed: Dec. 21, 1984

[51] Int. Cl.[4] .................... H01L 29/78; H01L 27/04; H01L 29/72

[52] U.S. Cl. ............................. 357/23.4; 357/23.8; 357/13; 357/35; 357/41; 357/43

[58] Field of Search .................. 357/23.4, 23.8, 13, 357/43, 41, 35

[56] References Cited

U.S. PATENT DOCUMENTS

| | | | |
|---|---|---|---|
| 4,048,649 | 9/1977 | Bohn | 357/23.4 |
| 4,300,150 | 11/1981 | Colak | 357/23.4 |
| 4,344,081 | 8/1982 | Pao et al. | 357/23.4 |

FOREIGN PATENT DOCUMENTS 0114435  8/1984  European Pat. Off. ........... 357/23.4

Primary Examiner—Martin H. Edlow
Assistant Examiner—E. Fallick
Attorney, Agent, or Firm—Robert T. Mayer; Steven R. Biren

[57] ABSTRACT

A combined lateral MOS/bipolar transistor includes an intermediate semiconductor layer of the same conductivity type as the channel region which extends laterally from the channel region to beneath the drain contact region of the device. Additionally, a floating semiconductor layer of opposite conductivity type to that of the channel region is provided between the intermediate layer and the substrate of the device. Both the intermediate layer and the substrate are relatively lightly doped, to effectively isolate the floating layer from above and below. This structure substantially improves the operating charatacteristics of the device, thus permitting operation in both the source-follower and common-source modes, while also providing a compact structure which features a relatively low normalized "on" resistance.

4 Claims, 1 Drawing Figure

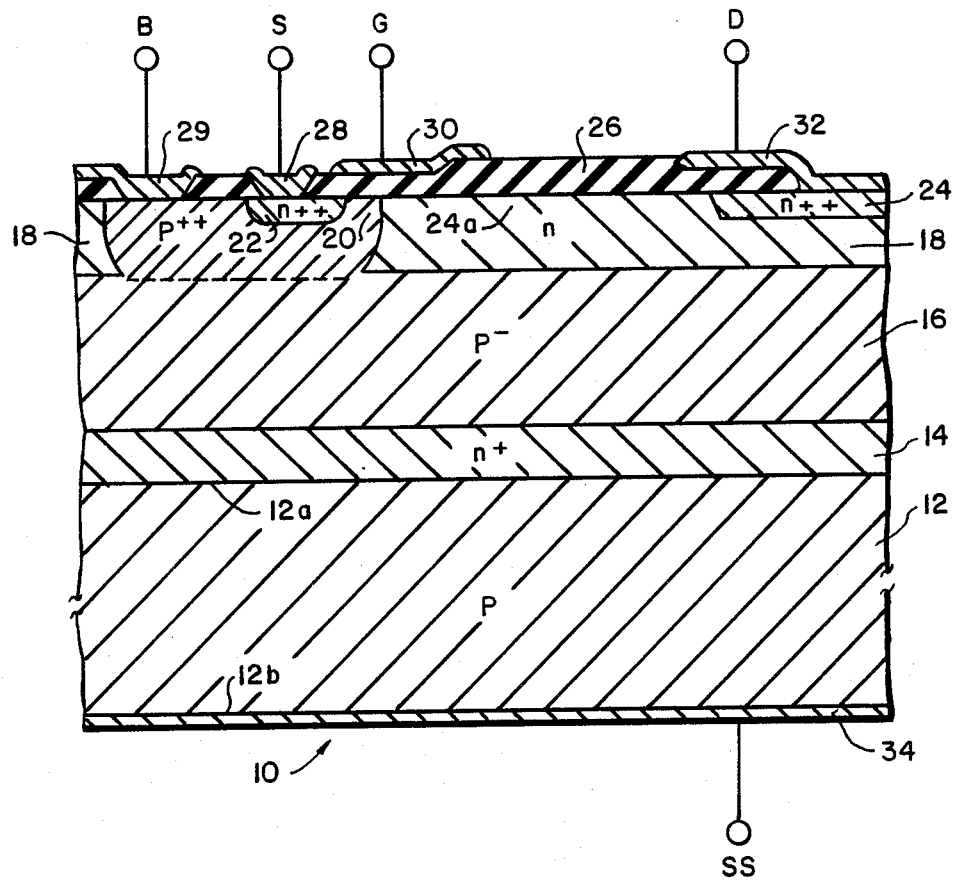

CONDUCTIVITY-ENHANCED COMBINED LATERAL MOS/BIPOLAR TRANSISTOR

BACKGROUND OF THE INVENTION

The invention is in the field of metal-oxide-semiconductor (MOS) devices, and relates more specifically to combined lateral MOS/bipolar transistors suitable for use in both common-source and source-follower applications.

A typical prior-art high voltage DMOS transistor is shown on page 1325 of the "IEEE Transactions on Electron Devices", Vol. ED-25, No. 11, November 1978, in a paper entitled "Tradeoff Between Threshold Voltage and Breakdown in High-Voltage Double-Diffused MOS Transistors", by Pocha et al. This device includes a semiconductor substrate of a first conductivity type (p-type), a surface layer of a second conductivity type (n-type) on the substrate, a surface-adjoining channel region of the first conductivity type in the epitaxial layer, a surface-adjoining source region of the second conductivity type in the channel region, and a surface-adjoining drain contact region of the second conductivity type in the epitaxial layer and spaced apart from the channel region. An insulating layer is provided on the surface layer and covers at least that portion of the channel region located between the source and drain. A gate electrode is provided on the insulating layer, over a portion of the channel region between the source and drain and is electrically isolated from the surface layer, while source and drain electrodes are connected respectively to the source and drain regions of the transistor. Such prior-art high-voltage DMOS transistors have a relatively thick surface layer (typically an epitaxial layer), in the order of about 25-14 30 microns for a breakdown voltage of about 250 V, as indicated in the Pocha et al paper. Furthermore, the punchthrough and avalanche breakdown characteristics of these devices relative to their epitaxial layer thickness make them unsuitable for efficient use in applications requiring high voltages.

It has been found that the breakdown characteristics of high-voltage semiconductor devices can be improved using the REduced SURface Field (or RESURF) technique, as described in "High Voltage Thin Layer Devices (RESURF Devices)", "International Electronic Devices Meeting Technical Digest", December 1979, pages 238-240, by Appels et al, and U.S. Pat. No. 4,292,642 to Appels et al. Essentially, the improved breakdown characteristics of these RESURF devices are achieved by employing thinner but more highly doped epitaxial layers to reduce surface fields.

The RESURF technique was applied to lateral double-diffused MOS transistors, as reported in "Lateral DMOS Power Transistor Design", "IEEE Electron Device Letters", Vol. EDL-1, pages 51-53, April 1980, by Colak et al and U.S. Pat. No. 4,300,150, and the result was a substantial improvement in device characteristics. It should be understood that in high-voltage DMOS devices, there is always a trade-off between breakdown voltage, on-resistance and device size, with the goal being to increase the breakdown voltage level while maintaining a relatively low on-resistance in a relatively compact device. Using the prior-art RESURF technique, and for reference assuming a constant breakdown voltage of about 400 volts, a very substantial improvement (e.g. decrease) in on-resistance may be obtained in a device of the same size as a conventional (thick epitaxial layer) DMOS device.

However, such prior-art RESURF devices, with their thin epitaxial layers, are not suitable for use in source-follower applications or other circuit arrangements where both the source and drain are at a high potential with respect to the substrate. For such applications, these devices would require a substantially thicker epitaxial surface layer, thus negating a principal advantage of the RESURF technique and increasing device size and cost, or they would require a lower epitaxial doping level, which would increase "on" resistance, again negating a principal advantage of the RESURF technique.

A lateral double-diffused MOS transistor suitable for use in source-follower applications which maintains the advantages associated with the RESURF technique is disclosed in U.S. patent application Ser. No. 451,993 filed 12/21/82 to Colak. The devices disclosed by Colak use a three-layer configuration in which the intermediate layer is highly doped, and in which the semiconductor zone forming the channel region of the device is directly in contact with the lowermost layer of the three-layer structure. Although the Colak device is a substantial improvement over prior-art devices, it still requires application of the RESURF principle in both the vertical and horizontal directions in its most advantageous high-voltage configuration, is more complex and difficult to manufacture, and is limited in terms of the specific "on" resistance that can be achieved. Additionally, bipolar conduction is not possible in the Colak configuration because of large substrate leakage.

SUMMARY OF THE INVENTION

It is therefore an object of the present invention to provide a triple-layer lateral MOS transistor capable of operating in both the common-source and source-follower modes which has improved specific "on" resistance characteristics and a simplified configuration that can be fabricated using relatively conventional processing techniques.

A further object of the invention is to provide such a transistor which is also capable of conduction in the bipolar mode.

In accordance with the invention, these objectives are achieved by an improved three-layer combined lateral MOS/bipolar transistor of the type described above which includes a first, floating semiconductor layer of the second conductivity type on the substrate, a second semiconductor layer of the first conductivity type and having a doping level at most equal to that of the substrate on the first, floating layer, and a third semiconductor surface layer of the second conductivity type on the second layer. The first semiconductor layer is called a floating layer because it is separated from the channel region of the device by the second semiconductor layer, which has a relatively high resistivity. This improved triple-layer configuration permits operation in both the common-source mode and the source-follower mode, while at the same time offering improved specific "on" resistance characteristics and a simplified device configuration.

BRIEF DESCRIPTION OF THE DRAWING

The FIGURE shows a vertical cross-sectional view of a combined lateral MOS/bipolar transistor in accordance with the invention.

DETAILED DESCRIPTION

As noted above, conventional lateral double-diffused MOS transistors are not suitable for efficient use in source-follower circuits, because of the relatively thick epitaxial layers required to avoid punchthrough breakdown in the source-follower mode. This results in an unduly large and expensive-to-manufacture device. Furthermore, prior-art RESURF techniques, which permit the use of thinner epitaxial layers, result in devices which are unsuited for source-follower applications because of similar high-voltage breakdown problems. More specifically, in typical source-follower applications, the device substrate is normally grounded, while the drain, source and channel regions of the device experience high voltage levels in the "on" state when these devices are operated with high power supply voltages. Under such conditions, conventional RESURF devices are subject to punchthrough breakdown (from channel to substrate) which precludes operation in the source-follower mode.

Additionally, in order to operate in the common-source mode, a device must also be able to operate in the "on" condition with low voltages at all nodes with reference to the substrate. For both common-source and source-follower modes, the "off" condition is characterized by high voltage on the drain, with all other nodes substantially at ground.

These conditions for dual-mode (common-source and source-follower) operation are met in the present invention by a device such as that shown in the FIGURE, employing a triple-layer structure with a floating layer above the substrate. It should be noted that the FIGURE is not drawn to scale, and in particular the vertical dimensions are exaggerated for improved clarity. Additionally, semiconductor regions of the same conductivity type are shown hatched in the same direction.

In the FIGURE, a combined lateral MOS/bipolar transistor 10 has a semiconductor substrate 12 of a first conductivity type, here p-type, on which the device is constructed. A first, floating buried semiconductor layer 14 of a second conductivity type opposite to that of the first, here n-type, is located on a first major surface 12a of the substrate, while a second semiconductor layer 16 of the first conductivity type is located on the first semiconductor layer. The basic layered construction of the device is completed by a third semiconductor surface layer 18 of the second conductivity type which is located on the second layer.

The device of the invention is constructed within this layered structure by providing a first surface-adjoining channel region 20 of p-type material in the third layer, with a surface-adjoining source region 22 of n-type material in a portion of p-type region 20. A first surface-adjoining drain contact region 24 of n-type material is provided in the third layer 18 and is spaced apart from the first channel region, and a portion of the third semiconductor surface layer 18 between the drain contact region 24 and the first channel region 20 forms an extended drain region 24a. Similarly, that portion of the second layer 16 extending from the channel region 20 to beneath the first drain contact region 24 forms an extended channel region.

An insulating layer 26 is provided on the surface of the transistor, over the third surface layer, and covers at least the portion of the first channel region 20 which is located between the source and drain regions. A gate electrode 30 is provided on the insulating layer 26, over the previously-mentioned portion of the first channel region, and is electrically isolated from the third layer by the insulating layer 26. An electrical connection to the drain contact region 24 is provided by a drain electrode 32, while a source electrode 28 is provided to contact the source region 22. Additionally, a base electrode 29 is connected to a portion of region 20 remote from the region beneath gate electrode 30. The basic construction of the device is completed by a substrate electrode 34 on lower major surface 12b of the substrate 12.

There are several principal differences between the present invention and the lateral double-diffused MOS transistor of U.S. patent application Ser. No. 451,993 mentioned above. The first semiconductor layer 14 here is a true floating layer, since the channel region 20 no longer extends down to make contact with it. Thus, the first layer is isolated from both above and below by the relatively low-conductivity substrate 12 and second semiconductor layer 16. In order to achieve this isolation, the doping level of the second semiconductor is selected to be very substantially lower than that of the corresponding layer in the prior art Colak triple-layer device. Finally, for bipolar operation, the present device includes a base electrode 29 connected to a portion of region 20, as discussed above.

While the configuration of the present invention can be advantageously used in various device constructions, the following table of approximate values will illustrate the configuration of a typical device having a breakdown voltage in excess of 400 volts:

| REGION (Ref. No.) | TYPE | TYPICAL DOPING | TYPICAL THICKNESS |
| --- | --- | --- | --- |
| First floating semiconductor layer (14) | n+ | $10^{14}$–$10^{15}$ donors/$cm^2$ | 4 microns |
| Second semiconductor layer (16) | p– | $4 \times 10^{14}$ acceptors/$cm^3$ | 8 microns |
| Third semiconductor layer (18) | n | $10^{12}$ donors/$cm^2$ | 5 microns |
| Source (22) | n++ | $10^{18}$–$10^{20}$ donors/$cm^3$ | 2 microns |
| Drain Contact (24) | n++ | $10^{18}$–$10^{20}$ donors/$cm^3$ | 2 microns |
| Channel (20) | p++ | $10^{17}$–$10^{20}$ acceptors/$cm^3$ | 5 microns |
| Substrate (12) | p– | $5 \times 10^{14}$ acceptors/$cm^3$ | — |

In an integrated circuit configuration, individual devices of the type described above may be isolated by either junction isolation or dielectric isolation. In the case of junction isolation, an isolation diffusion may be used to completely surround the active area of the transistor, in a conventional manner. Alternatively, the second and third semiconductor layers may be etched away and the transistor may then be surrounded by dielectric isolation extending down to the first, floating semiconductor layer.

The device described above may be fabricated using conventional and well-known techniques. Starting with a high-resistivity p-type substrate, the first, floating semiconductor layer is formed by ion implantation. The second semiconductor layer is then epitaxially grown, and the third surface layer is formed by ion implantation. The source, channel and drain contact regions are then formed by ion implantation or diffusion.

In operation, in the "off" state, the second semiconductor layer is depleted, thus providing RESURF action. The third, surface semiconductor layer is also depleted during the "off" state, in accordance with the RESURF principle. By providing the source, base and drain regions within the third, surface semiconductor layer (the drift region) a combined lateral MOS transistor and a lateral bipolar transistor are formed. More particularly, by providing a base electrode at a portion of the channel region 20 remote from the portion of the channel region beneath the gate electrode, a lateral bipolar transistor is formed having emitter zone 22, base zone 20 and collector zone 18.

In this combined MOS/bipolar transistor, the floating semiconductor layer 14 serves three main purposes. It not only allows operation in the source-follower mode, but also confines carriers to the second and third semiconductor layers, thus resulting in reduced base current in the lateral bipolar transistor and increased switching speed. Finally, the first, floating semiconductor layer also serves as a buried drain in the conductivity-modulated state for the MOS transistor, thus decreasing "on" resistance.

In order to achieve both common-source and source-follower capability in a single device, three conditions need to be satisfied. First, in the "off" condition (identical for both common-source and source-follower modes of operation) high voltage appears at the drain, while all other nodes are grounded. In this condition, the second and third semiconductor layers, along with portions of the substrate, are depleted in accordance with the RESURF principle. In this condition, the first, floating semiconductor layer acts as a field limiting ring. Following punch-through of the depletion layer to the floating buried semiconductor layer 14, the voltage between the drain and this floating buried layer is constrained at the punch-through voltage. The remainder of the high-voltage depletion layer is then taken up by the substrate.

In the common-source "on" condition, MOS action occurs through region 20, while the extended drain region in layer 18 conducts by drift. In addition, bipolar conduction is made possible by forward biasing the base by applying a positive voltage to base electrode 29. During this state, holes are injected into the drift region to modulate the conductivity of the third or surface semiconductor layer 18. At the same time, electrons are injected into the second semiconductor layer to modulate the conductivity there. Due to the lowered junction barrier, electrons are also free to flow down to the first, floating semiconductor layer, where they may then drift to the drain contact region. As a result of these multiple operating modes and multiple conducting paths, "on" resistance is dramatically lowered.

Finally, in the source-follower "on" condition, the second and third semiconductor layers are both at high voltages. Accordingly, only a small depletion layer exists and no pinching of the drift region occurs. In this condition, the first, floating semiconductor layer rises in potential to a voltage near that of the second semiconductor layer, thus resulting in a high-voltage depletion layer in the substrate. The breakdown voltage of the structure in this condition may be likened to that of the breakdown of a floating-base pnp transistor. For the doping levels indicated above, computer analysis indicates that a theoretical breakdown voltage in excess of 500 volts is attainable. This is a substantial improvement over the breakdown voltage attainable with known prior-art devices having low specific "on" resistance.

As a result of the advantageous operating modes discussed above, devices in accordance with the present invention offer considerable advantages over prior-art devices while at the same time using relatively conventional processing techniques. In particular, computer analysis indicates that for devices having a specific "on" resistance of less than 1 ohm·mm$^2$, breakdown voltages well in excess of 400 volts may be achieved. This represents an improvement in "on" resistance on the order of 200–400% over prior-art devices.

Thus, by using an improved triple-layer construction with a floating semiconductor layer, the present invention provides a combined lateral MOS/bipolar transistor which is capable of operating at high voltages in both the source-follower and common source modes, while at the same time providing a low normalized "on" resistance in a vertically compact and easily manufactured structure.

Finally, while the invention has been particularly shown and described with reference to certain preferred embodiments thereof, it will be understood by those skilled in the art that various changes in form and detail may be made without departing from the spirit and scope of the invention.

We claim:

1. A combined lateral MOS/bipolar transistor, which comprises:
    a semiconductor substrate of a first conductivity type;
    a first, floating semiconductor layer of a second conductivity type opposite to that of the first on a first major surface of said substrate;
    a second semiconductor layer of said first conductivity type on said first layer, the doping level of said second semiconductor layer being at most equal to that of said substrate;
    a third semiconductor surface layer of said second conductivity type on said second layer;
    a surface-adjoining channel region of said first conductivity type in said third layer and connected to said second semiconductor layer, said channel region being separated from said first, floating semiconductor layer by said second semiconductor layer;
    a surface-adjoining source region of said second conductivity type in said channel region;
    a surface-adjoining drain contact region of said second conductivity type in said third layer and spaced apart from said channel region;
    an extended drain region formed from a portion of said third layer between said drain contact region and said channel region;
    an insulating layer on the surface of said transistor and covering at least a first portion of the surface-adjoining channel region located between said source and said extended drain regions;
    a gate electrode on said insulating layer, over said first portion of the channel region and electrically isolated from said third layer;
    a base electrode connected to a second portion of said channel region remote from said first region; and
    source and drain electrodes connected respectively to the source and drain contact regions of the transistor.

2. A combined lateral MOS/bipolar transistor as in claim 1, wherein the doping level of said second layer is lower than that of said substrate and the doping level of said channel region is higher than that of said second layer.

3. A combined lateral MOS/bipolar transistor as in claim 2, wherein said substrate comprises p-type semiconductor material having a doping level of about $5 \times 10^{14}$ cm$^{-3}$, said second layer comprises p-type semiconductor material having a doping level of about $4 \times 10^{14}$ cm$^{-3}$ and a thickness of about 8 microns, and said first, floating semiconductor layer comprises n-type semiconductor material having a doping level of about $10^{14}$–$10^{15}$ cm$^{-2}$ and a thickness of about 4 microns.

4. A combined lateral MOS/bipolar transistor as in claim 3, wherein said third semiconductor layer comprises n-type semiconductor material having a doping level of about $10^{12}$ cm$^{-2}$ and a thickness of about 5 microns.

* * * * *